United States Patent [19]
Takahashi et al.

[11] Patent Number: 5,366,914
[45] Date of Patent: Nov. 22, 1994

[54] VERTICAL POWER MOSFET STRUCTURE HAVING REDUCED CELL AREA

[75] Inventors: Nobumitsu Takahashi; Mitsuasa Takahashi; Hitoshi Kubota, all of Tokyo, Japan

[73] Assignee: NEC Corporation, Tokyo, Japan

[21] Appl. No.: 11,151

[22] Filed: Jan. 29, 1993

[30] Foreign Application Priority Data

Jan. 29, 1992 [JP] Japan .................................. 4-013575
Feb. 28, 1992 [JP] Japan .................................. 4-042698

[51] Int. Cl.$^5$ ........................................... H01L 21/265
[52] U.S. Cl. ........................................ 437/41; 437/203
[58] Field of Search ................ 437/200, 203, 913, 41; 257/330

[56] References Cited

U.S. PATENT DOCUMENTS

| | | | |
|---|---|---|---|
| 5,023,196 | 6/1991 | Johnsen et al. | 437/40 |
| 5,128,278 | 7/1992 | Harada et al. | 437/192 |
| 5,182,222 | 1/1993 | Malhi et al. | 437/41 |

Primary Examiner—George Fourson
Assistant Examiner—David M. Mason
Attorney, Agent, or Firm—Sughrue, Mion, Zinn, Macpeak & Seas

[57] ABSTRACT

In a vertical power field effect transistor, a side surface of a gate electrode is covered with a side oxide film, and a groove is formed in self-alignment with the side oxide film to extend from a surface area of a silicon substrate between a pair of adjacent gate electrodes, to reach a base region. A tungsten film is filled into the groove thus formed, and a source electrode-is formed in contact with the tungsten film within the groove.

2 Claims, 5 Drawing Sheets

VERTICAL POWER MOSFET STRUCTURE HAVING REDUCED CELL AREA

BACKGROUND OF THE INVENTION

1. Field of the Invention

The present invention relates to a power semiconductor device, and more specifically to a vertical power MOSFET (metal-oxide-semiconductor field effect transistor) and a method for manufacturing the same.

2. Description of Related Art

In "IEEE Transactions on Electron Devices", Vol. ED-32, No., January 1985, pages 2-6, UEDA et al has proposed a vertical power MOSFET structure with an extremely reduced on-resistance, which is called a rectangular-grooved MOSFET.

This vertical power MOSFET includes a silicon substrate, a drain layer formed on the silicon substrate, a base layer formed on the drain layer, and a source layer formed on the base layer. A plurality of rectangular-grooves are formed to extent downward from a surface of the source layer through the base layer so as to reach the drain layer. An inner surface of the grooves thus formed is coated with a gate insulator, and a gate electrode formed of a polysilicon is deposited on the gate insulator. In addition, an interlayer insulator is covered on each gate electrode and to fill into each of the grooves. On the other hand, between each pair of adjacent grooves, a contact hole for formation of a back gate is formed to extend downward from a surface of the source layer to reach the base layer, and a metal electrode is filled into the contact hole. An aluminium source electrode is deposited on the interlayer insulator and the metal electrode filled into the contact hole, so that the source electrode is in electrical contact with the source layer and the base layer.

For example, in the case of the rectangular-grooved vertical power MOSFET having a breakdown voltage of 60 V, an N+ silicon substrate doped with antimony at a concentration of $2 \times 10^{18}/cm^3$ is prepared, and a layer having a thickness of about 20 $\mu$m and doped with phosphorus so as to have a specific resistance of 1Ω cm is epitaxially grown on the substrate. This phosphorus doped layer forms an N-type drain layer. Thereafter, a P-type base layer is formed on the surface of the drain layer by ion-implantation and heat-diffusion, and an N-type source layer is formed on the surface of the base layer by ion-implantation and heat-diffusion. Then, a plurality of trench grooves are formed by a photoresist process and an anisotropic etching, and an oxide film having a thickness of about 100 nm is formed on a surface of the substrate including an inner surface of the trench groove formed. The oxide film is selectively removed by a photoresist process so that only a gate oxide remains.

Thereafter, a polysilicon film having a thickness of about 600 nm is deposited by means of a LPCVD (low pressure chemical vapor deposition) process, and phosphorus is diffused in the deposited polysilicon film so that the polysilicon film has a sheet resistance of about 11Ω/□. Further, the doped polysilicon film is selectively removed and patterned by a photoresist process so as to form the gate electrode composed of the polysilicon film. Then, an interlayer insulator film is deposited by a CVD process, and contact holes for back gates are formed by the photoresist process and anisotropic etching. A tungsten is grown within the contact holes by means of a selective CVD process so as to substantially completely fill the contact holes. Finally, an aluminum source electrode is formed by a Sputtering so that the deposited source electrode is in electrical contact with the tungsten electrode filled in the contact holes.

In the above mentioned conventional process, in order to form the contact holes for the back gate by means of the photoresist process, it is necessary to ensure a margin for alignment and a side or lateral etching. In the ease of the vertical power MOSFET having a breakdown voltage of 60 V, a distance between the contact hole and the gate electrode was required to have not less than 2.5 $\mu$m. In addition, the tungsten electrode was necessary to have a lateral width of not less than 5 $\mu$m.

The above mentioned problems were similar in the case of an ordinary vertical power MOSFET in which no rectangular-groove for the gate electrode is formed and the gate electrode is formed on a planar upper surface of a substrate through a gate oxide. In the ordinary vertical power MOSFET, in addition, when an oxide film coveting a side surface of the gate electrode is formed, it was also necessary to ensure a margin for alignment and a side or lateral etching.

Accordingly, in the prior art vertical power MOSFETs, a microminiaturization of the back gate part is limited by the margin for alignment in the photolithography and a side or lateral etching.

SUMMARY OF THE INVENTION

Accordingly, it is an object of the present invention to provide a vertical power MOSFET and a method for manufacturing the same, which have overcome the above mentioned defect of the conventional ones.

Another object of the present invention is to provide a vertical power MOSFET having a reduced size of back gate part, and a method for manufacturing the same.

The above and other objects of the present invention are achieved in accordance with the present invention by a vertical power field effect transistor comprising a drain region of a first conductivity type semiconductor, a base region of a second conductivity type semiconductor and formed in contact with the drain region, a source region of the first conductivity type semiconductor and formed in contact with the base region, a gate insulator film formed to cover the source region, the base region and the drain region and to extend in such a manner as to locate the base region between the source region and the drain region, a gate electrode formed on the gate insulator film, a side insulator film formed on the source region so as to cover a side surface of the gate electrode and the gate insulator film, a groove formed in alignment with a surface of the side insulator film so as to extend downward from a semiconductor surface and to reach the base region, and a metal film filled in the groove.

According to another aspect of the present invention, there is provided a method for manufacturing the above mentioned vertical power field effect transistor, comprising the steps of forming an interlayer insulator film on the gate electrode, depositing an insulator film on a whole surface, anisotropically etching the deposited insulator film so that the deposited insulator film remains only on each side surface of the gate electrode so as to form a side insulator film, etching the source region using the side insulator film as a mask, so that a groove is formed in the source region, filling a metal into the groove, and forming the source electrode in electrical contact with the metal filled in the groove.

The vertical power field effect transistor in accordance with the present invention, has the metal electrode filled and the groove formed in aligned with the side insulator film which remains on the side surface of the gate electrode by the anisotropic etching.

The groove, which can be called a "contact hole", is formed in a self-alignment with the gate electrode. Therefore, the margin for alignment which was required in the conventional photoresist process and the margin for the side etching which was also required in the conventional process, are no longer necessary, and therefore, the vertical power field effect transistor in accordance with the present invention can be microminiaturized further in comparison with the conventional structure.

The above and other objects, features and advantages of the present invention will be apparent from the following description of preferred embodiments of the invention with reference to the accompanying drawings.

DESCRIPTION OF THE PREFERRED EMBODIMENTS

Figure 1:
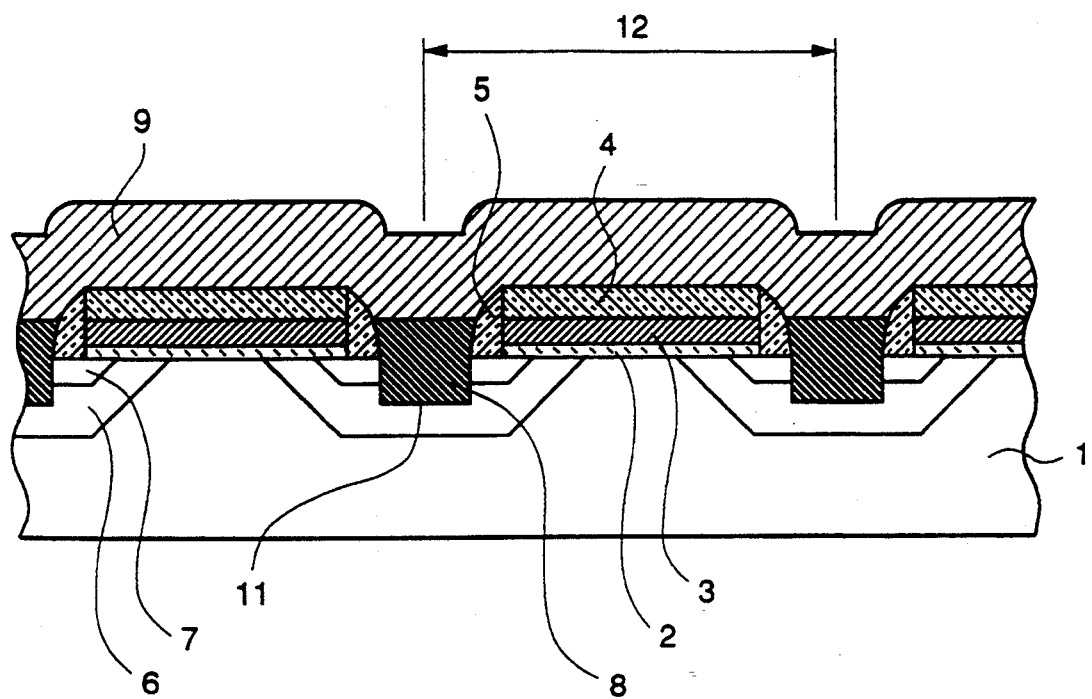
FIG. 1 is a diagrammatic sectional view of a first embodiment of the vertical power field effect transistor in accordance with the present invention.

Referring to FIG. 1, there is shown a diagrammatic sectional view of a first embodiment of the vertical power field effect transistor in accordance with the present invention.

The shown vertical power field effect transistor is an N-type vertical power MOS field effect transistor, which will be explained with reference to FIGS. 2A to 2E illustrating a process for manufacturing the vertical power field effect transistor shown in FIG. 1.

Figure 2A:
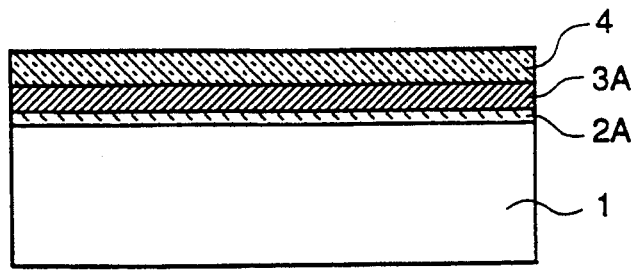
FIGS. 2A to 2E are diagrammatic sectional views of the vertical power field effect transistor for illustrating a process for manufacturing the vertical power field effect transistor shown in FIG. 1.

As shown in FIG. 2A, on an N-type silicon substrate 1, an oxide film 2A having a thickness of 10 nm to 200 nm is formed. Then, a polysilicon film 3A having a thickness of 100 nm to 1,000 nm is formed on the oxide film 2A by a CVD process, and phosphorus is diffused into the polysilicon film 3A so that the polysilicon film 3A becomes an N-type. Furthermore, an interlayer insulator film 4 formed of for example PSG (phosphosilicate glass) having a thickness of 100 nm to 1,000 nm is deposited on the polysilicon film 3A.

Figure 2B:
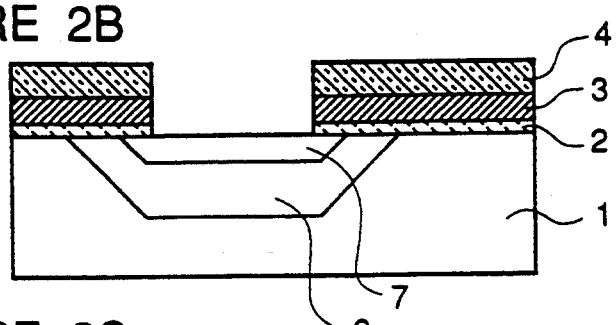

Then, as shown in FIG. 2B, the stacked structure of the interlayer insulator film 4, the polysilicon film 3A and the oxide film 2A is patterned so as to form a gate oxide film 2 and a gate electrode 3. Thereafter, by using the patterned stacked structure as a mask, boron is introduced into the silicon substrate 1 by means of an ion implantation or diffusion, so that a P-type base region 6 is formed which will constitute a channel when a completed device is in operation. Furthermore, phosphorus is introduced by using the patterned stacked structure as a mask, so that a source region 7 is formed in a base region 6, but is clearly smaller and shallower than the base region 6.

Figure 2C:
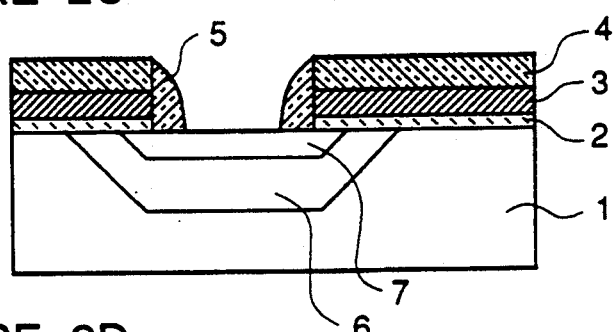

Thereafter, a PSG film is deposited on a whole upper surface of the substrate, and the deposited PSG film is anisotropically etched so as to form side oxide films 5 which covers only a side surface of the gate electrode 3 and the gate oxide film 2, as shown in FIG. 2C.

Figure 2D:
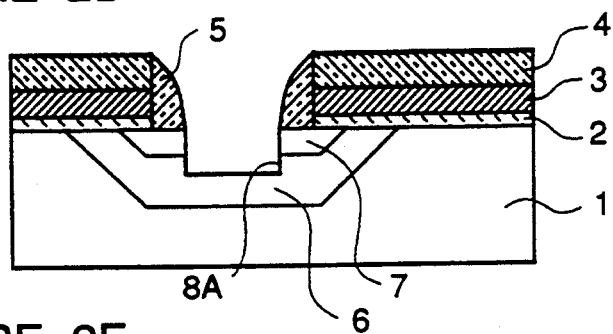

As shown in FIG. 2D, the substrate I is anisotropically etched by using the side oxide films 5 as a mask, so as to form, in a serf-alignment manner, a groove 8A which extends downward from a surface of the silicon substrate to reach the base region 6

Figure 2E:
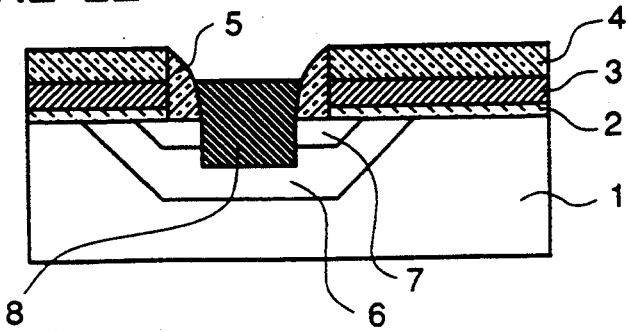

Then, as shown in FIG. 2E, the groove 8A thus formed is filled with a tungsten film 8 having a thickness of 0.3 $\mu$m to 2 $\mu$m grown by a selective CVD process. In addition, an aluminum film is evaporated on a whole surface, and then, patterned to form a source electrode 9 which is electrically connected to the tungsten film 8, as shown in FIG. 1.

Thus, the vertical power field effect transistor as shown in FIG. 1 is completed. In this vertical power field effect transistor, the substrate 1 functions as a drain region.

In the first embodiment of the vertical power field effect transistor as mentioned above, the side oxide film 5 deposited on the side surfaces of the gate electrode, and a back gate part 11 formed of the tungsten film 8 and a portion of the source electrode 9 in contact with the tungsten film 8, can be formed without using photolithography. Namely, the side oxide film 5 can be formed by anisotropically etching the oxide film which is deposited to cover the whole surface including the patterned gate electrodes, and the back gate part 11 is formed by filling the tungsten film 8 into the groove 8A which was formed in a self-alignment manner using the side oxide film 5. Accordingly, a width of the back gate part 11 is determined by the size of the groove 8A.

Accordingly, the margin (for example, 3.0 $\mu$m) for alignment and the side etching in the case of forming the gate electrode side surface oxide film in the conventional process for manufacturing the vertical power MOSFET, as well as the margin (for example, 3.0 $\mu$m) for alignment and the side etching in the case of forming the back gate part in the conventional process for manufacturing the vertical power MOSFET, become unnecessary. Therefore, a cell size, defined by Reference Numeral 12 in FIG. 1, can be reduced by 6.0 $\mu$m. For example, in the case of the vertical power MOSFET having the breakdown voltage of 60 V, the cell size can be reduced from 25 $\mu$m to 19 $\mu$m or less, and therefore, an ON-resistance per unit area can be improved by about 20%.

Figure 3:
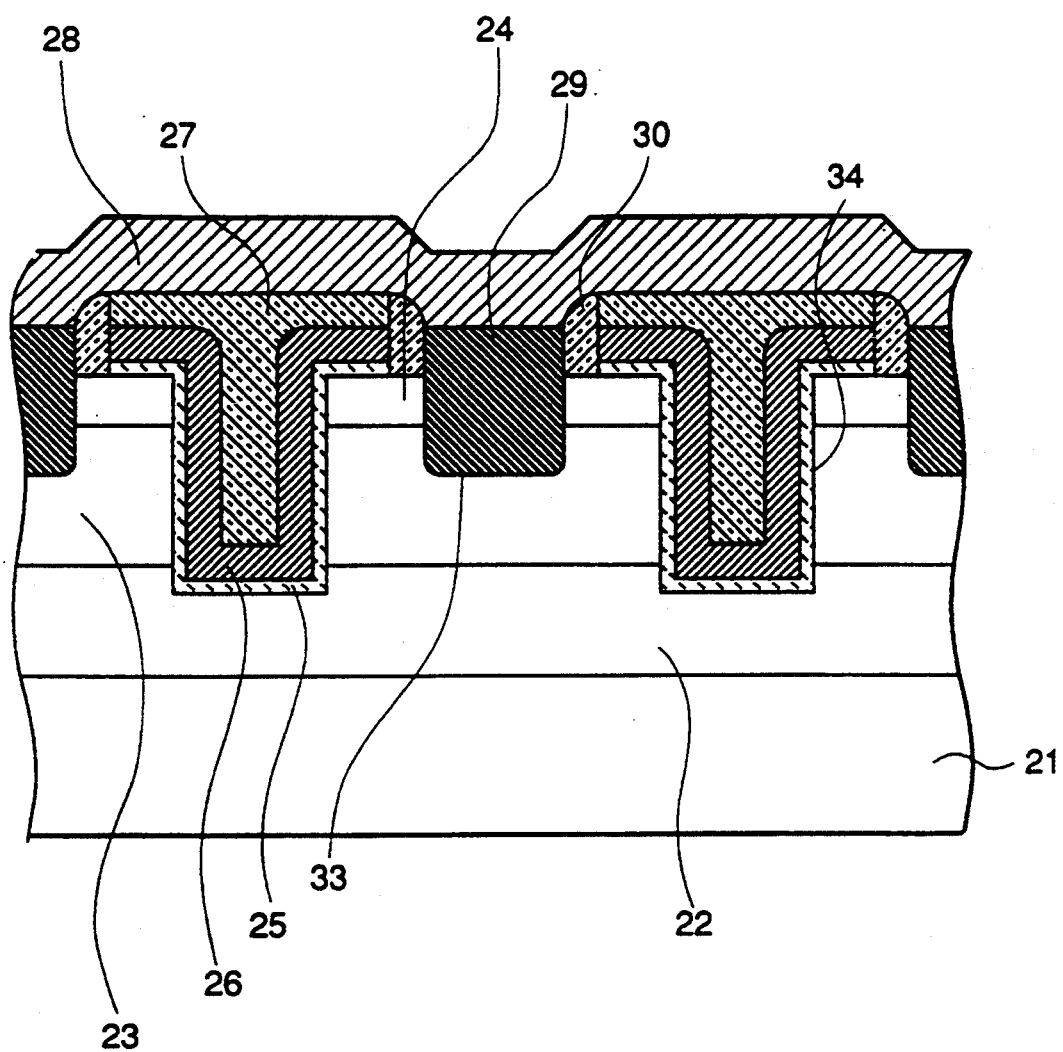
FIG. 3 is a diagrammatic sectional view of a second embodiment of the vertical power field effect transistor in accordance with the present invention.

Referring to FIG. 3, there is shown a diagrammatic sectional view of a second embodiment of the vertical power field effect transistor in accordance with the present invention.

The shown vertical power field effect transistor is a so-called rectangular-grooved N-type vertical power MOS field effect transistor. This vertical power MOS field effect transistor includes an N-type silicon substrate 21, an N-type drain layer 22 of an epitaxially grown silicon layer formed on the substrate 21, a P-type base layer 23 formed on the drain layer 22, and an N-type source layer 24 formed on the base layer 23. A groove or trench 34 is formed to extend downward from a surface of the source layer 24 so as to penetrate through the source layer 24 and the base layer 23 and to reach an internal portion of the drain layer 22. A trench inner wall portion of the base layer 23 constitutes a channel region.

A gate oxide film 25 is formed to cover an inner wall surface of the trench 34 and to extend on a trench peripheral surface portion of the source layer 24, and a gate electrode 26 is formed on the gate oxide film 25. In addition, an interlayer insulator film 27 is formed on the gate electrode 26. A side insulator film 30 is formed on the source layer 24 so as to cover each side end surface of the gate electrode 26. This side insulator film 30 is different from the interlayer insulator layer 27.

A contact hole 33 is formed in the substrate to have an inner wall surface in alignment with an outer surface of the side insulator film 30, namely, in a self-alignment manner. This contact hole 33 is filled with a tungsten electrode 29 which is used for application of a back gate bias voltage. Therefore, this tungsten electrode 29 is in electrical contact with the source layer 24 and the base layer 23. A source electrode 28 is formed to extend over the interlayer insulator film 27 and in electrical contact with the tungsten electrode 29.

Now, a process for manufacturing the vertical power field effect transistor shown in FIG. 3 will be explained with reference to FIGS. 4A to 4F.

Figure 4A:
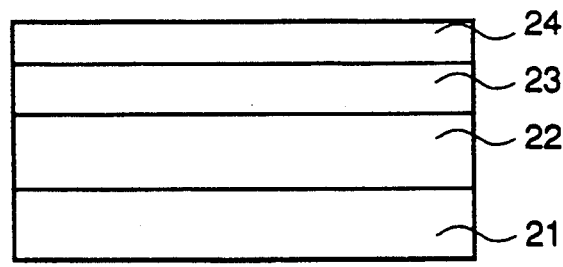
FIGS. 4A to 4F are diagrammatic sectional views of the vertical power field effect transistor for illustrating a process for manufacturing the vertical power field effect transistor shown in FIG. 3.

A silicon layer is epitaxially grown on the N-type silicon substrate 21, and doped with impurity so as to form the N-type drain layer 22. The P-type base layer 23 is formed by diffusing P-type impurity into a surface of the drain layer 22, and the N-type source layer 24 is formed by diffusing N-type impurity into the base layer 23. These impurity diffusions can be performed by a photoresist process, an ion implantation or a thermal diffusion. Thus, as shown in FIG. 4A, the drain layer 22, the base layer 23 and the source layer 24 are formed on the N-type silicon substrate 21.

Figure 4B:
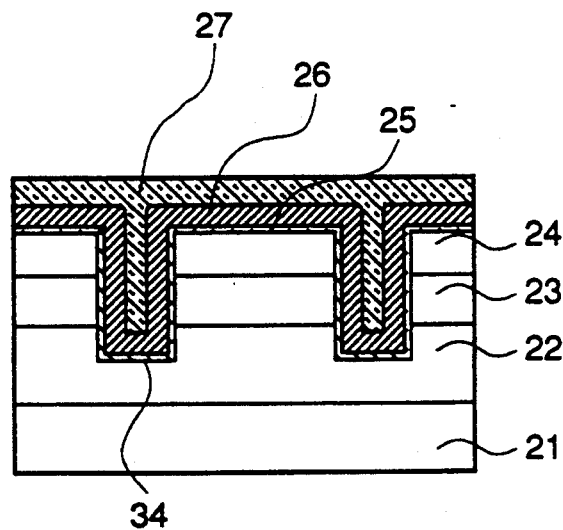

Thereafter, the trench 34 is formed in the substrate 21 by a photoresist process and a anisotropic etching, and then, an gate oxide film 25 is formed, a polysilicon layer (becoming the gate electrode) is deposited, and an interlayer insulating film 27 of an oxide film is formed, as shown in FIG. 4B.

Figure 4C:
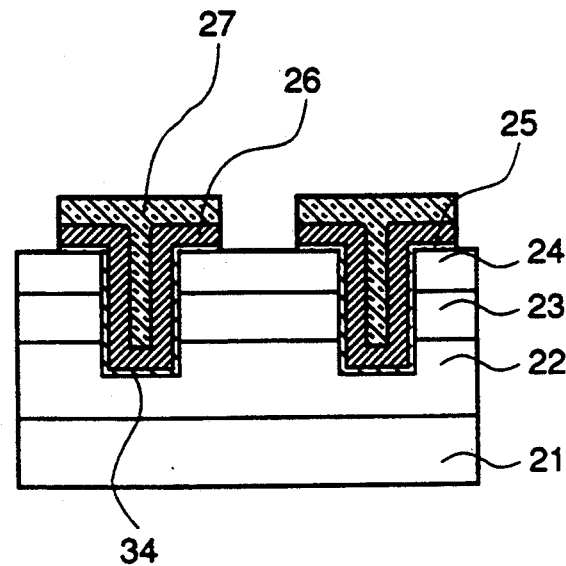
Figure 4D:
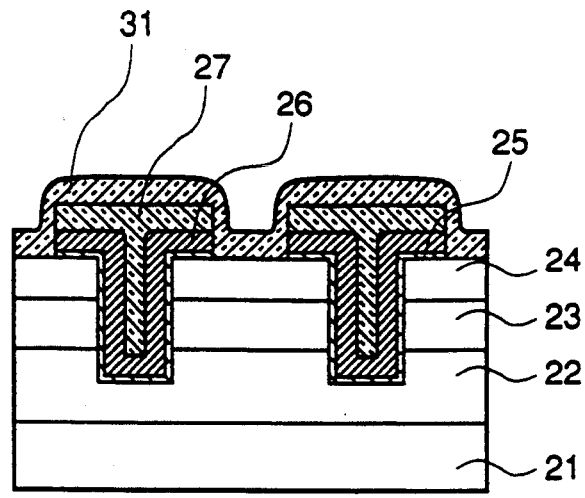

As shown in FIG. 4C, these layers are selectively removed by a photoresist process, and thereafter, as shown in FIG. 4D, an oxide film 31 is grown on a whole surface.

Figure 4E:
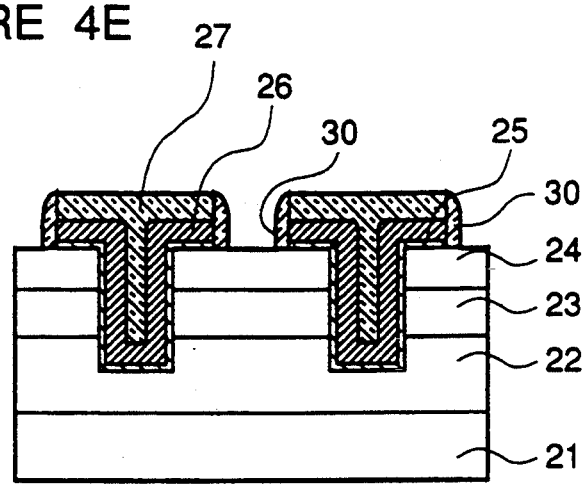

Then, the oxide film 31 is anisotropically etched to the effect that the oxide film 31 remains only on each side surface of the gate electrode 26 and the other oxide film is completely removed. The oxide film 31 remaining on each side surface of the gate electrode 26 forms the side oxide film 30, as shown in FIG. 4E.

Figure 4F:
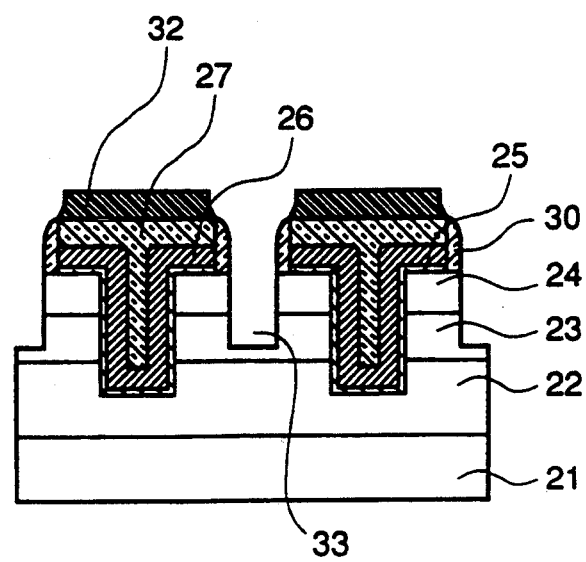

Thereafter, as shown in FIG. 4F, a resist mask 32 is formed on the interlayer insulator 27. In this connection, it is not necessarily required that a pattern of the resist mask 32 is completely in matching with or in alignment with the pattern of the interlayer insulator film 27, and therefore, the resist mask 32 is allowed to overlap the side oxide film 30 to some degree. An anisotropic etching is performed by using the side oxide film 30 as a mask, so as to form a contact hole 33 in self-alignment with the gate electrode 26, as shown in FIG. 4F.

Thereafter, the resist mask 32 is removed, and tungsten is filled into the contact hole 33 so as to form the tungsten electrode 29 in self-alignment with the gate electrode 26. Then, the source electrode 28 is formed by an evaporation or a photoresist process. Thus, the vertical power field effect transistor is completed as shown in FIG. 3.

For example, if in the conventional process for the rectangular-grooved vertical power MOS field effect transistor, the margin for alignment in the photoresist process is 0.5 μm, and the margin for the side etching is 1.0 μm, the lateral cell size can be reduced by 3.0 μm. For example, in the case of the vertical power MOSFET having the breakdown voltage of 60 V, the base region width can be reduced from 10 μm to 7 μm or less, and therefore, can be improved by about 30%.

The above mentioned embodiments have been the N-channel vertical power MOSFET. However, in the embodiments shown in FIGS. 1 and 3, if the P-type regions or layers are changed into N-type regions or layers and the N-type regions or layers are changed into P-type regions or layers, it is of course possible to constitute the P-channel vertical power MOSFET.

The invention has thus been shown and described with reference to the specific embodiments. However, it should be noted that the present invention is in no way limited to the details of the illustrated structures but changes and modifications may be made within the scope of the appended claims.

We claim:

1. A method for manufacturing a vertical power field effect transistor comprising the steps of:

forming a first insulating film covering on a principal surface of a semiconductor substrate of a first conductivity type;

forming a conducting layer on said first insulating film;

forming a first interlayer insulating film covering said conducting layer;

patterning a stacked structure formed of said first insulating film, said conducting layer and said first interlayer film so as to form a patterned stacked structure and to expose a portion of said substrate uncovered by said patterned stacked structure, said first insulating film of said patterned stacked structure forming a gate insulator film, said conducting layer of said patterned stacked structure forming a gate electrode;

introducing an impurity of a second conductivity type opposite to said first conductivity type into said exposed portion of said substrate by using the patterned stacked structure as a mask, so that a base region extending under said gate electrode is formed;

introducing an impurity of said first conductivity type by using the patterned stacked structure as a mask, so that a source region smaller than said base region is formed in said base region and extends under said gate electrode;

forming a second interlayer insulating film on said principal surface of said substrate;

anisotropically etching said second interlayer insulating film so as to form a side insulating film which covers only each side surface of the gate electrode and the gate insulator film;

anisotropically etching said substrate by using the side insulating films as a mask, so as to form, in a self-alignment manner, a groove which extends downward from said principal surface of said silicon substrate to pass through said source region and to reach said base region;

filling said groove with a metal film;

forming a metal film evaporated on the entire resulting surface; and patterning said metal film to form a source electrode which is electrically connected to said metal filled in said groove.

2. A method for manufacturing a vertical power field effect transistor comprising the steps of:

forming a drain layer of a first conductivity type at an upper surface of a semiconductor substrate of said first conductivity type;

forming at an upper surface of said drain layer a base layer of a second conductivity type opposite to said first conductivity type;

forming a source layer of said first conductivity type at an upper surface of said base layer;

forming in said substrate a plurality of vertical trenches separated from each other and passing through said source layer and said base layer to reach said drain layer; forming a gate oxide film covering said principal surface of said substrate and an inner surface of said trenches;

forming a gate electrode layer covering said gate oxide film at said principal surface of said substrate and within said trenches;

forming a first interlayer insulating film on said gate electrode layer at said principal surface of said substrate and within said trenches;

patterning a stacked structure composed of said gate oxide film, said gate electrode layer and said first interlayer insulating film so as to form a pattern stacked structure and to expose a portion of said substrate, said gate electrode layer of said patterned stacked structure forming a gate electrode;

forming a second interlayer insulating film on said principal surface of said substrate;

anisotropically etching said second interlayer insulating film so as to form a side insulating film which covers only each side surface of the gate electrode, the gate insulator film and the remaining first interlayer insulating film;

anisotropically etching said substrate by using the side insulating films as a mask, so as to form, in a self-alignment manner, a groove which extends downward from said principal surface of said substrate to pass through said source region and to reach said base region;

filling said groove with a metal film;

forming a metal film evaporated on the entire resulting surface; and patterning said metal film to form a source electrode which is electrically connected to said metal filled in said groove.

* * * * *